United States Patent
Barth et al.

(10) Patent No.: US 9,276,475 B2
(45) Date of Patent: Mar. 1, 2016

(54) SWITCHED MODE ASSISTED LINEAR REGULATOR WITH DECOUPLED OUTPUT IMPEDANCE AND SIGNAL PATH BANDWIDTH

(71) Applicant: Texas Instruments Incorporated, Dallas, TX (US)

(72) Inventors: Carsten Barth, Waldstetten (DE); John Hoversten, Lafayette, CO (US); Steven Berg, Littleton, CO (US); Vahid Yousefzadeh, Boulder, CO (US); Arie Van Staveren, Hazerswoude (NL); Bert Helleman, Voorschoten (NL)

(73) Assignee: Texas Instruments Incorporated, Dallas, TX (US)

( * ) Notice: Subject to any disclaimer, the term of this patent is extended or adjusted under 35 U.S.C. 154(b) by 264 days.

(21) Appl. No.: 13/963,407

(22) Filed: Aug. 9, 2013

(65) Prior Publication Data
US 2014/0125299 A1   May 8, 2014

Related U.S. Application Data

(60) Provisional application No. 61/681,901, filed on Aug. 10, 2012.

(51) Int. Cl.
*H02M 3/158* (2006.01)
*H02M 1/00* (2007.01)
*H02M 3/156* (2006.01)

(52) U.S. Cl.
CPC .... *H02M 3/1584* (2013.01); *H02M 2001/0045* (2013.01); *H02M 2003/1566* (2013.01)

(58) Field of Classification Search
CPC ...................... H02M 2001/0041; H02M 3/158

USPC ................................................... 323/268, 269
See application file for complete search history.

(56) References Cited

U.S. PATENT DOCUMENTS

| | | | | |
|---|---|---|---|---|
| 5,258,701 A | * | 11/1993 | Pizzi et al. | 323/269 |
| 6,229,289 B1 | * | 5/2001 | Piovaccari et al. | 323/268 |
| 6,636,023 B1 | * | 10/2003 | Amin | 323/268 |
| 6,661,211 B1 | * | 12/2003 | Currelly et al. | 323/268 |
| 7,084,612 B2 | | 8/2006 | Zinn | |

(Continued)

OTHER PUBLICATIONS

PCT Search Report mailed Nov. 27, 2013.

*Primary Examiner* — Gary L Laxton
*Assistant Examiner* — Kyle J Moody
(74) *Attorney, Agent, or Firm* — Andrew Viger; Frank D. Cimino

(57) ABSTRACT

A switched mode assisted linear (SMAL) amplifier/regulator architecture can be configured to supply regulated power to a dynamic load, such as an RF power amplifier. Embodiments of a SMAL regulator can include a linear amplifier and a switched mode converter parallel coupled at a supply node, and configured such that the amplifier sets load voltage, while the amplifier and the switched converter are cooperatively controlled to supply load current. The amplifier can include separate feedback loops: an external relatively lower speed feedback loop for controlling signal path bandwidth, and an internal relatively higher speed feedback loop for controlling output impedance bandwidth of the linear amplifier. The linear amplifier can be AC coupled to the supply node, and the switched converter can be configured with a capacitive charge control loop that controls the switched converter to effectively control the amplifier to provide capacitive charge control.

18 Claims, 9 Drawing Sheets

(56) References Cited

U.S. PATENT DOCUMENTS

| | | |
|---|---|---|
| 7,653,366 B2 | 1/2010 | Grigore |
| 8,988,054 B2 * | 3/2015 | Marty .......................... 323/273 |
| 9,059,631 B2 * | 6/2015 | Park et al. |
| 2005/0275392 A1 | 12/2005 | Wong et al. |
| 2008/0054860 A1 | 3/2008 | Angell |
| 2008/0088284 A1 | 4/2008 | Weng |
| 2014/0042999 A1 * | 2/2014 | Barth et al. .................... 323/271 |
| 2015/0155783 A1 * | 6/2015 | Li et al. ......................... 323/268 |

\* cited by examiner

SWITCHED MODE ASSISTED LINEAR REGULATOR WITH DECOUPLED OUTPUT IMPEDANCE AND SIGNAL PATH BANDWIDTH

CROSS-REFERENCE TO RELATED APPLICATIONS

Priority is hereby claimed under USC§119(e) to U.S. Provisional Application 61/681,901 (filed Aug. 10, 2012).

BACKGROUND

1. Technical Field

This Patent Disclosure relates generally to hybrid or composite amplifier/regulator architectures that combine a switched mode amplifier/regulator and a linear amplifier/regulator, also referred to as a linear assisted switched mode or a switched mode assisted linear architectures.

2. Related Art

In one application for hybrid architectures, a hybrid regulator includes a switched mode converter (or switched converter) and a linear amplifier coupled in parallel at a power output node, and cooperatively controlled to supply regulated load voltage and load current. In such hybrid regulators, the higher bandwidth but less efficient linear amplifier supplies the higher frequency content of the output power, while the more efficient but lower bandwidth switched converter provides the lower frequency content.

One application for a hybrid regulator is as an envelope modulated power supply for an RF (radio frequency) power amplifier (PA). Envelope modulation/tracking improves power amplification efficiency for high peak-to-average power ratio (PAR) signals such as typical of mobile RF communications—envelope modulated regulators dynamically control the RF PA supply voltage, tracking PA output power variations/requirements.

Design parameters for an envelope modulated/tracking power supply include noise, distortion and bandwidth. Noise and distortion generated by the envelope modulator and injected into the PA supply pin will transfer to the PA output spectrum. Envelope modulator bandwidth will typically be significantly higher than the baseband signal bandwidth. For hybrid regulator architectures, a significant noise source is switching noise from the switched mode converter, and an important design criteria is to reduce small signal output impedance of the linear amplifier over the operational bandwidth of the envelope modulator (the output impedance bandwidth).

Hybrid regulators can be configured with the linear amplifier AC coupled to the power output node. The linear amplifier is only required to supply AC content of the load voltage—the DC average voltage at the output of the regulator is maintained on the AC coupling (DC-decoupling) capacitor.

While this Background information is presented in the context of regulated power supplies for power amplifier applications, this Patent Disclosure is not limited to such applications, but is more generally directed to hybrid architectures that include a switched mode converter and a linear amplifier.

BRIEF SUMMARY

This Brief Summary is provided as a general introduction to the Disclosure provided by the Detailed Description and Figures, outlining various aspects, features and advantages of the disclosed invention, and should not be interpreted as identifying key elements of the invention, or otherwise defining the scope of the invention that is the subject of this Patent Disclosure, aspects of which are defined by the Claims.

The Disclosure describes apparatus and methods for adapting a switched mode assisted linear (SMAL) amplifier architecture as a regulator supplying a regulated dynamic load voltage and an associated load current to a dynamic load characterized by a signal (dynamic) bandwidth. The SMAL amplifier/regulator architecture includes a switched mode converter (switched converter or switcher) coupled to a (linear) amplifier at a supply node that is coupled to the load. The SMAL amplifier/regulator is configured for, and characterized by a signal path bandwidth, which can be less than the signal bandwidth of the dynamic load.

In one embodiment, a SMAL regulator according to aspects of the invention implements a methodology for decoupling signal path bandwidth from the output impedance bandwidth of the (linear) amplifier, including: (a) configuring the amplifier to independently control the signal path bandwidth of the SMAL regulator and an output impedance bandwidth of the amplifier, thereby decoupling the configuration of output impedance bandwidth from signal path bandwidth, by establishing first and second negative feedback loops such that the first feedback loop is higher speed than the second feedback loop, and wherein (i) the first feedback loop is configured to control the output impedance bandwidth of the amplifier, and (ii) the second feedback loop is configured to control the signal path bandwidth of the SMAL regulator; (b) in response to an input signal with the signal bandwidth, supplying from the amplifier the corresponding regulated load voltage with the signal path bandwidth; (c) in response to a switching control signal with a switcher bandwidth that is less that the signal path bandwidth, supplying from the switcher a switcher load current corresponding to the load current and the switcher bandwidth; and (d) supplying, from the amplifier, an amplifier load current corresponding to the signal path bandwidth and the load current not supplied by the switcher load current.

Other aspects and features of the claimed invention will be apparent to those skilled in the art from the following Disclosure.

DETAILED DESCRIPTION

Figure 1A:
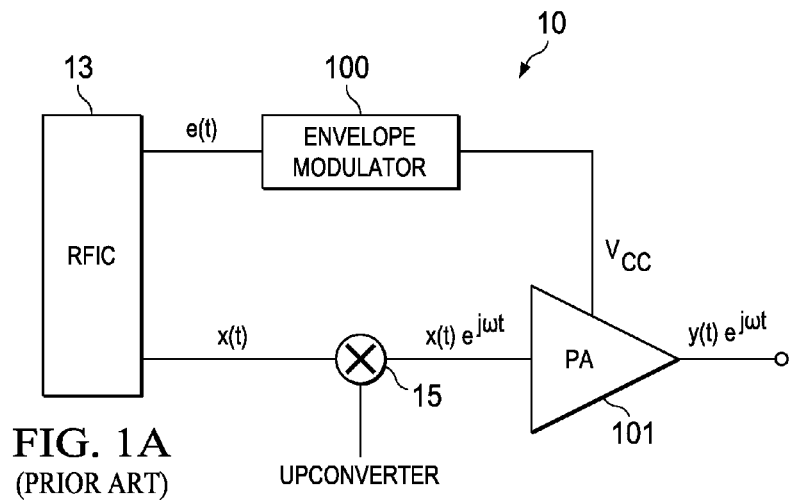
FIGS. 1A and 1B illustrate an example RF transmitter system including a power amplifier (PA), and including an envelope modulator configured to supply envelope modulated power to the PA that tracks power variations/requirements of the PA.

This Description and the Figures disclose example embodiments and applications that illustrate various features and advantages of the invention(s) that is(are) the subject of this Patent Disclosure, aspects of which are defined by the Claims. Known circuits, functions and operations are not described in detail to avoid unnecessarily obscuring the principles and features of the invention.

This Disclosure describes embodiments of a hybrid amplifier/regulator architecture according to the invention, implemented as a switched mode assisted linear (SMAL) regulator supplying a regulated dynamic load voltage and an associated load current to a dynamic load characterized by a signal (dynamic) bandwidth. Embodiments of the SMAL regulator include a switched mode converter (switched converter or switcher) coupled to a (linear) amplifier at a supply node that is coupled to the load. The SMAL amplifier/regulator is configured for, and characterized by a signal path bandwidth, which can be less than the signal bandwidth of the dynamic load, and is configured such that linear amplifier sets the regulated (dynamic) load voltage, and the switched converter (characterized by a switcher bandwidth less than the signal path bandwidth) supplies lower frequency load current, while the (higher bandwidth) linear amplifier supplies load current not supplied by the switched converter. Example embodiments of the SMAL regulator are described in the context of an example application as an envelope modulated (tracking) power supply for an RF power amplifier (PA). The terms envelope modulation and envelope tracking are used interchangeably.

In brief overview, embodiments of the SMAL regulator according to the invention are configured with the amplifier coupled to the supply node through a coupling capacitor, and implement AC coupling with capacitive charge control, wherein: (a) the amplifier circuit, in response to a dynamic input signal, supplies the corresponding regulated load voltage based on the signal path bandwidth; (b) the switcher circuit, in response to a switching control signal with a switcher bandwidth that is less than the signal path bandwidth, supplies a switcher load current based on the switcher bandwidth; and (c) the amplifier circuit supplies through the coupling capacitor an amplifier load current corresponding to the load current not supplied by the switcher load current. The switcher circuit includes: (a) a current control loop configured to provide the switching control signal to control the switcher circuit to supply the switcher load current; and (b) a nested charge control loop configured to introduce into the current control loop an offset corresponding to a difference between a voltage across the coupling capacitor and a predetermined DC-average coupling capacitor voltage; (c) such that, in response to a non-zero offset, the current control loop provides a corresponding adjusted switching control signal. In response to the adjusted switching control signal, the switcher circuit supplies a corresponding adjusted switcher load current, causing the amplifier circuit to output an adjusted amplifier load current with a non-zero average corresponding to the non-zero offset, thereby adjusting the voltage on the coupling capacitor to the predetermined DC-average coupling capacitor voltage. For other embodiments, the SMAL regulator can be configured such that: (a) the current control loop can maximize the switcher load current, such that the amplifier load current is minimized; (b) the signal path bandwidth can be less than the signal bandwidth; and (c) the current control loop can implement hysteretic control with a predetermined hysteretic window, and wherein the charge control loop is configured to introduce an offset to the hysteretic window corresponding to the predetermined coupling capacitor voltage.

In brief overview, other embodiments of the SMAL regulator according to the invention are configured for decoupling signal path bandwidth from the output impedance bandwidth of the (linear) amplifier, including configurations in which: (a) the amplifier circuit, in response to a dynamic input signal, supplies the corresponding regulated load voltage; (b) the switcher circuit, in response to a switching control signal with a switcher bandwidth that is less than the signal path bandwidth, supplies a switcher load current based on the switcher bandwidth; (c) the amplifier circuit supplies an amplifier load current corresponding to the load current not supplied by the switcher load current; and (d) the amplifier circuit is configured with first and second negative feedback loops such that the first feedback loop is higher speed than the second feedback loop, and (i) the first feedback loop is configured to control an output impedance bandwidth of the amplifier, and (ii) the second feedback loop is configured to control the signal path bandwidth substantially independently of the output impedance bandwidth.

RF Envelope Modulation.

In an RF transmitter using envelope modulation, the supply voltage provided to a PA is dynamically modulated to correspondingly track output power variation required by the PA. Envelope modulation provides significant efficiency improvement for high peak-to-average power ratio (PAR) signals typical of RF communications (such as used in mobile handsets and base stations).

FIG. 1A is a functional illustration of an example RF transmitter system 10 including an RF power amplifier 11 and an RF baseband subsystem 13 commonly referred to as an RFIC (RF integrated circuit). RFIC 13 generates a baseband signal x(t), which is up-converted 15 to RF, and then amplified by the PA (such as for driving an RF antenna).

Envelope modulator 100 supplies power to the PA (the PA supply rail), modulating supply voltage in response to an envelope signal e(t) from RFIC 13. The envelope tracking signal e(t) tracks output power variations/requirements of the PA as determined by RFIC 13. That is, RFIC 13 splits the baseband signal between two separate paths: an envelope tracking signal e(t) that carries envelope (magnitude) information, and a constant magnitude signal x(t), that carries phase information:

$$e(t)=|s(t)| \qquad (1)$$

$$x(t)=s(t)/|s(t)| \qquad (2)$$

These two signals are merged by the PA. Because the operation in (1) is nonlinear, even though s(t) is bandwidth limited, the envelope signal e(t) will not be, and as a result, the envelope modulation bandwidth typically will be significantly larger than the signal path bandwidth.

Figure 1B:
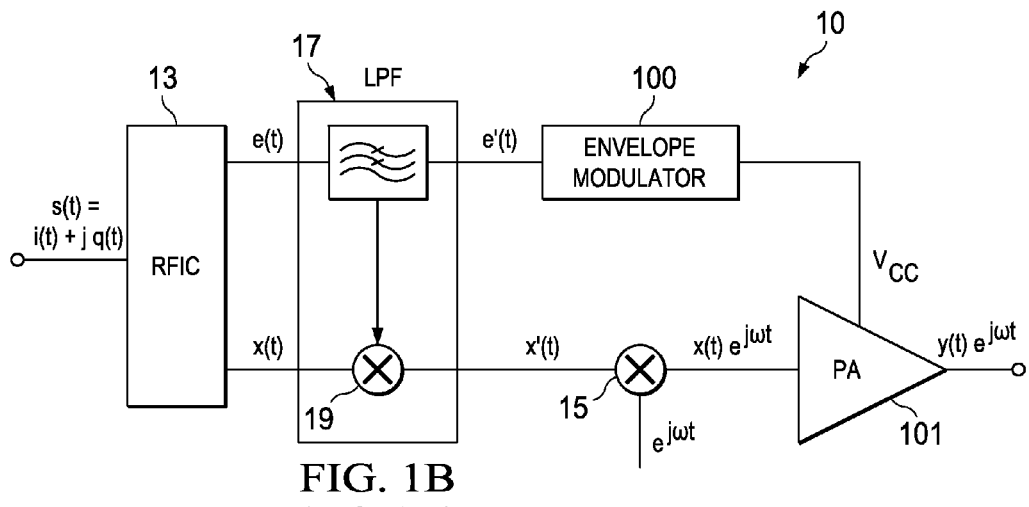

FIG. 1B illustrates an alternate embodiment of the RF transmitter system 10 that includes a low pass filter 17 after RFIC 13. The low pass filter can be configured to reduce the bandwidth of the envelope signal e(t) input to envelope modulator 100. Symbol adjustment 19 prior to up-conversion/mixing 15 can be used to compensate for latency introduced by the low pass filter.

This alternate embodiment represents design trade-offs in terms of overall efficiency of the RF transmitter system 10, including the envelope modulator 100. For example, reducing the bandwidth of envelope modulator 100 (that is, reducing the bandwidth of the envelope tracking signal e(t) input to the envelope modulator) sacrifices some PA efficiency in that the tracking bandwidth of the PA supply voltage is reduced, but is advantageous in terms of improved envelope modulator efficiency. Including symbol adjustment in the x(t) signal path will increase signal path bandwidth, and therefore will increase the bandwidth requirement of the upconverter/mixer and the input to the PA.

Other advantages of limiting envelope tracking bandwidth include reduced receive band noise, and reduced PA gain error. RX band noise is noise measured at the output of the PA within the receive band of the RF transceiver—by reducing the envelope tracking bandwidth, the envelope modulator will introduce less noise and/or distortion, reducing RX band noise. PA gain error is proportional to the difference between the envelope tracking signal through the envelope modulator and the actual envelope tracking signal—if envelope tracking bandwidth is reduced, PA gain error is reduced, reducing RX band noise.

SMAL Regulator—DC Coupled.

Figure 2:
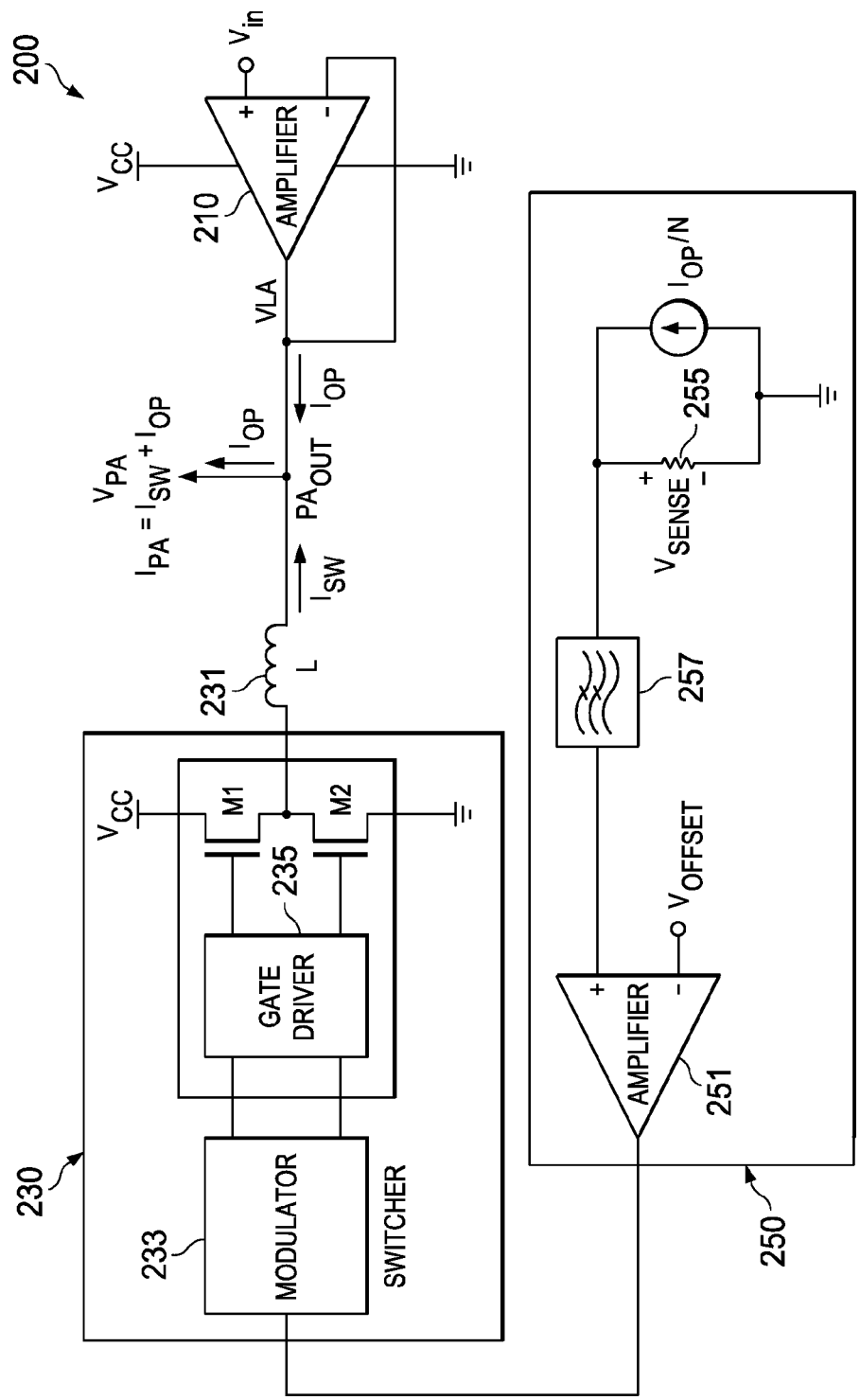
FIG. 2 illustrates an example embodiment of a SMAL (switched mode assisted linear) regulator, such as for application as an envelope modulator/supply for an RF PA, including a switched mode converter configured to supply load current, and a linear amplifier (DC coupled to the switched converter) configured to supply regulated load voltage, and to supply load current not supplied by the switched converter.

FIG. 2 illustrates an example embodiment of a SMAL regulator 200 configured to provide regulated power to a load—load voltage $V_{PA}$ and load current $I_{PA}$. SMAL regulator 200 includes a linear amplifier 210 and a switched mode converter 230, with an associated switching controller 250, configured as a current supply. Linear amplifier 210 and switched mode converter 230 are parallel coupled at a current summing output node $PA_{OUT}$ (coupled to the supply pin of a power amplifier). For this example embodiment, the linear amplifier is DC coupled to the PAOUT node.

The linear amplifier stage 210 supplies a dynamic load voltage $V_{PA}$ in response to a dynamic input voltage $V_{IN}$. An example application for SMAL regulator 200 is as an envelope modulated supply for an RF PA (FIG. 1A), such that the dynamic input voltage $V_{IN}$ is an envelope tracking signal (from an RFIC) and the SMAL regulator supplies dynamic regulated load voltage $V_{PA}$, and the required load current $I_{PA}$, to the PA, Linear amplifier 210 is configured to provide voltage regulation, setting the dynamic load voltage $V_{PA}$ supplied to the PA. Linear amplifier also supplies the required load current $I_{OP}$ not supplied by switched converter 230. SMAL regulator 200 can be configured to maximize the $I_{SW}$ load current from switched converter 230 (current supply), thereby minimizing the $I_{OP}$ load current required to be supplied by linear amplifier 210. In this configuration, a lower bandwidth switched converter supplies lower frequency $I_{SW}$ load current, and a higher bandwidth linear amplifier supplies higher frequency $I_{OP}$ load current, such that $I_{SW}+I_{OP}$ at the $PA_{OUT}$ node supplies the $I_{PA}$ load current required by the PA.

An example embodiment of linear amplifier 210 is described below (FIGS. 7A and 7B), including configuring the linear amplifier to establish the signal path bandwidth for SMAL regulator 200, and including decoupling the configuration of signal path bandwidth from the configuration of output impedance bandwidth. Decoupling output impedance bandwidth from signal path bandwidth enables the output impedance bandwidth to be maximized relatively independently of signal path bandwidth, an important advantage because, in addition to supplying higher frequency load current ($I_{OP}$), linear amplifier 210 can be configured to reject switching noise and ripple generated by switched converter 230.

The example embodiment of switched converter 230 is implemented as a buck converter configured as a current supply/source. Switched converter 230 includes a buck inductor 231, but does not include the output capacitor of a conventional buck voltage regulator. In effect, linear amplifier 210 replaces the conventional buck output capacitor. This example converter topology is a design choice, and alternative implementations of the switched converter include boost, buck-boost and flyback.

According to conventional buck converter design, a controlled modulator circuit 233 controls gate drivers 235 for buck switches (FETs) M1/M2. A switching controller 250 is configured to control the switching duty cycle of the switched converter 230.

Switching controller 250 is implemented with a hysteretic voltage comparator 251. One input to comparator 251 is derived from the $I_{OP}$ load current supplied by the linear amplifier 210, and the other input is a predetermined offset $V_{OFFSET}$. As illustrated, $I_{OP}$/N from the linear amplifier is converted to a voltage by a resistor 255, and low pass filtered 257 to reduce switching frequency. For the example embodiment, $I_{OP}$/N is provided by one of the N output transistors of linear amplifier 210, so that the $I_{OP}$ load current supplied by the linear amplifier is formed by N−1 of the N output transistors.

Switching controller 250 can be configured to optimize efficiency of SMAL regulator 200 in supplying power to the PA, which typically results from maximizing the $I_{SW}$ component of the $I_{PA}$ load current supplied by switched converter 230 (subject to bandwidth limitations), and correspondingly minimizing the $I_{OP}$ load current required to be supplied by the linear amplifier 210 (and therefore power dissipation in the linear amplifier). That is, the $I_{SW}$ current sourced/sunk by switched converter 230 is maximized, and the $I_{OP}$ current required to be sourced/sunk by linear amplifier 210 is minimized, such that the higher speed but less efficient linear amplifier delivers the higher frequency $I_{OP}$ content of the dynamic $I_{PA}$ load current, while the more efficient but lower bandwidth switched converter provides the lower frequency $I_{SW}$ content. Typically, this efficiency optimization results from setting the $V_{OFFSET}$ input to comparator 251 to zero.

For the example buck implementation of switched converter 230, bandwidth is limited primarily by the maximum current slew rate through the buck inductor 231 (with inductance L) given by Rising Slew Rate=$(V_{CC}-V_{PA})/L$ Falling Slew Rate=$-V_{PA}/L$ linear amplifier 210 then dynamically sources/sinks the difference between the required $I_{PA}$ load current and the $I_{SW}$ load current supplied by switched converter 230. The inductance of the buck inductor represents a design trade-off.

Figure 3:
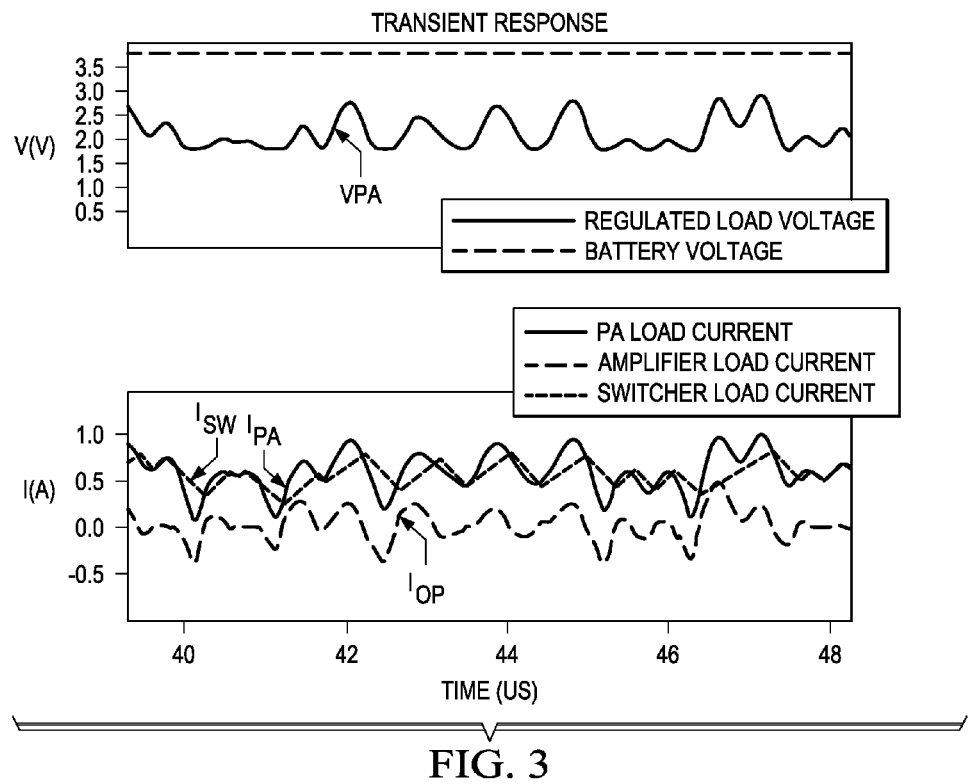
FIG. 3 illustrates, for the SMAL regulator embodiment illustrated in FIG. 2, example waveforms for: (a) in an upper plot, PA load/supply voltage $V_{PA}$ tracking PA output power variations/requirements, and (b) in the lower plot, associated PA load current $I_{PA}$, together with separate plots for $I_{SW}$ load current supplied by the switched mode converter, and additional $I_{OP}$ load current required to be supplied by the linear amplifier.

FIG. 3 illustrates, for SMAL regulator 200, example waveforms for: (a) in the upper plot, $V_{PA}$ load voltage tracking PA output power variations/requirements, as set by the linear amplifier, and (b) in the lower plot, associated $I_{PA}$ load current ($I_{SW}+I_{OP}$), together with separate plots for the lower frequency $I_{SW}$ load current supplied by the switched converter, and the higher frequency $I_{OP}$ load current required to be supplied by the linear amplifier. Note that based on the dynamic requirements of the $I_{PA}$ load current and the bandwidth limitations of the switched converter, both the linear amplifier and the switched converter can source and sink current.

Referring to FIG. 2, as noted, SMAL regulator 200 and linear amplifier 210 can be configured with a signal path bandwidth that is significantly higher than the bandwidth of the switched converter 230. For example, an implementation of a SMAL regulator according to this Disclosure can be configured for a signal path bandwidth in the range of 20 MHz with a converter switching frequency in the range 1-15 MHz (depending on passive components and signal characteristics).

AC Coupling with Capacitive Charge Control.

Figure 4:
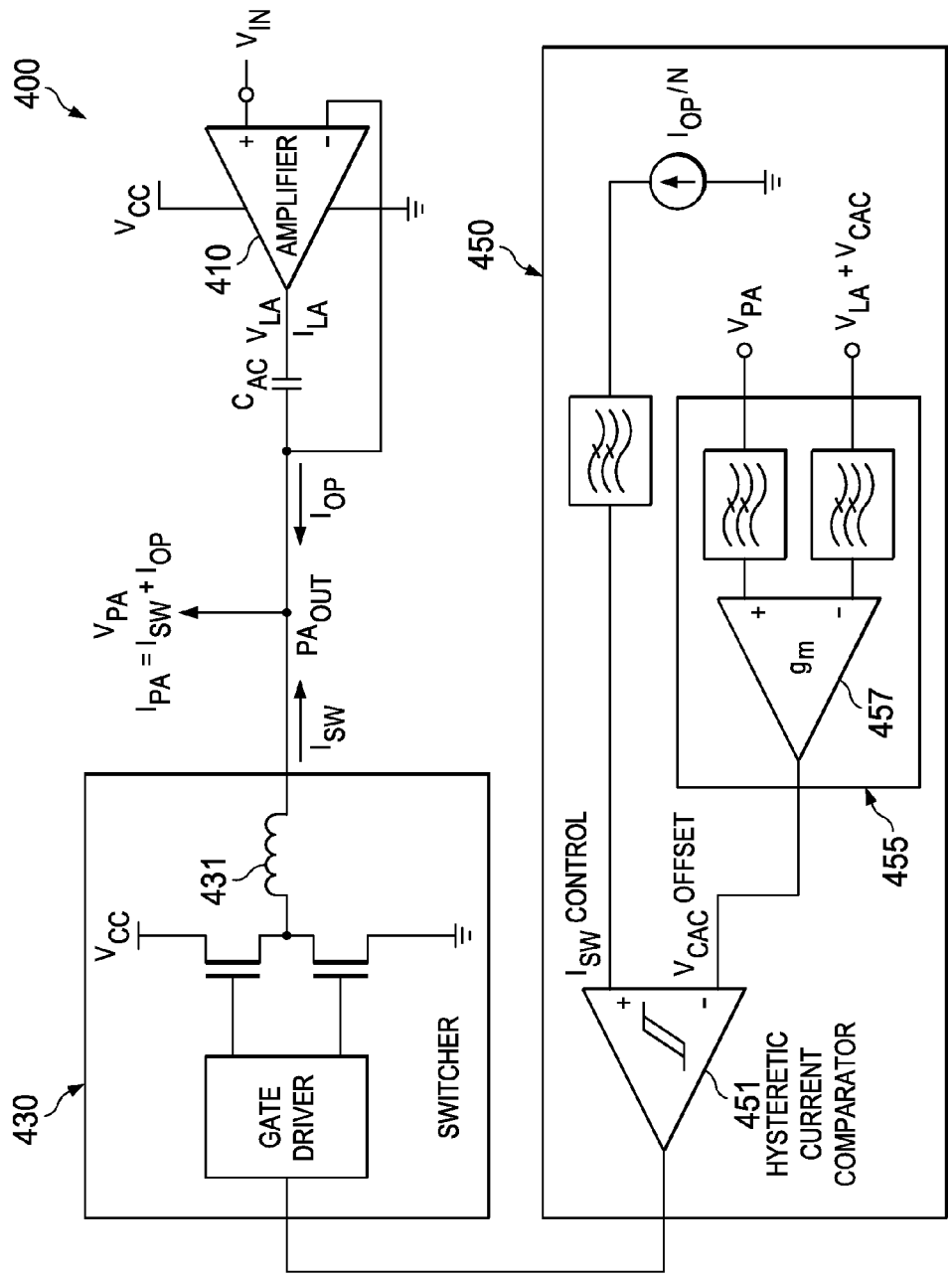
FIG. 4 illustrates an example embodiment of a SMAL regulator in which the linear amplifier is AC coupled to a switched mode converter configured as a current supply, and in which the switching (current) control loop is configured to effectively control the linear amplifier to provide capacitive charge control for the coupling capacitor.

FIGS. 4, 5 (A/B) and 6 illustrate embodiments of a SMAL regulator in which the linear amplifier is AC coupled to the $PA_{OUT}$ node through an AC coupling (DC decoupling) capacitor $C_{AC}$. For each embodiment, the coupling capacitor $C_{AC}$ is coupled between the linear amplifier output and the $PA_{OUT}$ node, within the (external) feedback loop of the linear amplifier.

With AC coupling, a predetermined DC-average voltage is maintained on the $C_{AC}$ coupling capacitor, and the linear amplifier supplies the AC content of the $V_{PA}$ load voltage supplied by the SMAL regulator ($PA_{OUT}$ supply node). The $I_{OP}$ load current supplied by the linear amplifier is coupled through the $C_{AC}$ coupling capacitor to the $PA_{OUT}$ node, so that, to maintain the predetermined DC-average voltage on $C_{AC}$, the steady-state average current through the $C_{AC}$ coupling capacitor is zero.

The SMAL regulator can be configured to control the average current input from the linear amplifier into the coupling capacitor $C_{AC}$ to maintain a predetermined DC-average voltage on $C_{AC}$: (a) example embodiments in FIGS. 4 and 5A/B illustrate a SMAL regulator in which the switched mode converter stage includes a capacitive charge control loop that controls the $I_{SW}$ load current to effectively control the output current of the linear amplifier, and (b) an alternate example embodiment in FIG. 6 illustrates a SMAL regulator in which the linear amplifier stage includes a charge control transistor with associated capacitive charge control, configured to control the current output from the linear amplifier into the coupling capacitor.

For the example embodiments, $C_{AC}$ capacitance can be relatively large (for example, in the range of 5-10 uF). In this configuration, the $C_{AC}$ coupling capacitor is not designed to filter switching noise/ripple from switched converter, but instead acts as a DC voltage level shifter, storing a predetermined DC-average of the $V_{PA}$ output voltage. The predetermined level of the DC-average voltage on the CAC coupling capacitor can be set from a register or by calculation from one or more registers.

FIG. 4 illustrates an example embodiment of a SMAL regulator 400 in which a linear amplifier 410 is AC coupled to the $PA_{OUT}$ node through an AC coupling capacitor $C_{AC}$. A switched mode converter 430 includes a switching controller 450 with nested control loops, including a $V_{CAC}$ control loop 455 configured to effect capacitive charge control.

Functionally, $V_{CAC}$ control loop 455 introduces a $V_{CAC}$ offset into an $I_{SW}$ control loop ($I_{OP}/N$) that controls the $I_{SW}$ load current supplied by switched converter 430. Responsive to the $V_{CAC}$ offset, switched converter 430 correspondingly adjusts the $I_{SW}$ load current such that the linear amplifier 410 adjusts its $I_{LA}$ output current to a non-zero average. As a result, the voltage on the $C_{AC}$ coupling capacitor changes based on the average current through the $C_{AC}$ coupling capacitor to the $PA_{OUT}$ node, charging/discharging the coupling capacitor $C_{AC}$ to maintain the DC-average voltage $V_{CAC}$.

A design consideration for the AC coupled embodiment of the SMAL regulator 400 is establishing the DC-average voltage $V_{CAC}$ relative to the supply voltage of linear amplifier 410. For purposes of illustration, ignoring the DC-average voltage $V_{CAC}$, SMAL regulator 400 can supply an output voltage above supply (for example, battery) voltage so long as the signal peak-to-peak amplitude is less than the supply voltage. For example, for a supply voltage of 2.5V, boosting the LA supply rail would not be required if the PA load voltage $V_{PA}$ swings from 2V to 3.6V because the signal peak-to-peak amplitude (1.6V in this example) is below the 2.5V supply voltage (and will remain so as long as the supply voltage remains above 1.6V with appropriate headroom). That is, for the AC coupled example embodiment, the design constraints at the LA are that both $V_{PP}$ (peak-to-peak), and $V_{PA-DC}$ (average $V_{PA}$ output voltage) must be less than the supply voltage by some headroom (in some embodiments, $V_{PA-DC}$ could be zero volts). Thus, AC coupling provides a degree of design freedom in specifying a maximum PA load voltage $V_{PA}$ without requiring boosting the supply rail of the linear amplifier 410. Specifically, $V_{PK}$ can be greater than the supply voltage as long as the $V_{PP}$ and $V_{PA-DC}$ constraints are observed. Contrast the example DC coupled implementation illustrated in FIG. 2 in which $V_{PK}$ is constrained.

Switching controller 450 is configured to control the switched converter (buck) 430, both (a) for steady-state operation, to supply $I_{SW}$ load current that minimizes the $I_{OP}$ load current required to be supplied by linear amplifier 410, and (b) as necessary, to adjust $I_{SW}$ to cause the linear amplifier to output a non-zero-average $I_{LA}$ output current that, in addition to supplying the required $I_{OP}$ load current, changes/discharges the coupling capacitor $C_{AC}$ to maintain the DC-average $V_{CAC}$ coupling capacitor voltage.

Switching controller 450 includes a hysteretic current comparator 451 that defines an $I_{SW}/I_{OP}$ hysteretic window. Hysteretic current comparator 451 receives inputs derived from two (nested) control loops: (a) an $I_{SW}$ control loop based on $I_{OP}/N$ corresponding to the $I_{OP}$ load current supplied by linear amplifier 410, and (b) the $V_{CAC}$ control loop 455 based on the voltage across the coupling capacitor $C_{AC}$. Referring to FIG. 2, the $V_{CAC}$ control loop basically replaces the $V_{OFFSET}$ input to the hysteretic voltage comparator 251.

The $I_{SW}$ control loop operates to drive the buck switched converter to supply $I_{SW}$ load current to minimize the $I_{OP}$ load current from the linear amplifier by maintaining $I_{OP}/N$ (averaged by low pass filtering within the $I_{SW}/I_{OP}$ hysteretic window. As a result, the linear amplifier outputs (steady-state) a zero-average output current $I_{LA}$, coupled through the coupling capacitor $C_{AC}$ to the $PA_{OUT}$ summing node as the $I_{OP}$ load current supplied by linear amplifier 410.

The $V_{CAC}$ control loop 455 is implemented with a transconductance (gm) amplifier 457. The $V_{CAC}$ control loop introduces a $V_{CAC}$ charge control offset into the $I_{SW}/I_{OP}$ hysteretic window, corresponding to the predetermined coupling capacitor voltage $V_{CAC}$. Transconductance (gm) amplifier 457 provides a current input to the hysteretic comparator 451 proportional the voltage across the $C_{AC}$ coupling capacitor referenced to $V_{CAC}$: gm*[$V_{PA}-(V_{LA}+V_{CAC})$]. That is, the $V_{CAC}$ offset introduced by the $V_{CAC}$ control loop corresponds to the difference between (a) $V_{PA}$, the PA load voltage, and (b) ($V_{LA}+V_{CAC}$), the linear amplifier output voltage $V_{LA}$ plus the predetermined coupling capacitor voltage $V_{CAC}$. Low pass filtering these inputs reduces the requirement for high frequency common mode rejection.

When the voltage on the $C_{AC}$ coupling capacitor deviates from the predetermined $V_{CAC}$, the $I_{SW}/I_{OP}$ hysteretic window is offset ($V_{PA}-(V_{LA}+V_{CAC})$ is non-zero), so that the $I_{SW}$ control loop operates to drive switched converter 430 to output an $I_{SW}$ load current that causes the linear amplifier to correspondingly output a non-zero-average $I_{LA}$ current. This non-zero-average $I_{LA}$, in addition to providing the $I_{OP}$ load current through the coupling capacitor $C_{AC}$, charges/discharges $C_{AC}$ to $V_{CAC}$, i.e., until [$V_{PA}-(V_{LA}+V_{CAC})$] is zeroed. At that point, the nested $I_{SW}$ control loop continues steady-state operation to drive switched converter 430 to supply $I_{SW}$ load current that minimizes the $I_{OP}$ load current required to be supplied by linear amplifier 410. For this steady-state operation (with $V_{CAC}$ on the $C_{AC}$ coupling capacitor), the linear amplifier outputs a zero-average $I_{LA}$ current through $C_{AC}$ to the $PA_{OUT}$ summing node as the $I_{OP}$ load current.

For example, assume that switched converter 410 is sourcing current when the $I_{OP}$ load current provided by linear amplifier (LA) 410 is greater than 50 mA, and sinking current when $I_{OP}$ is below 50 mA, so that the $I_{SW}/I_{OP}$ hysteresis window is +50/−50 mA (zero-average $I_{LA}$ current). If the DC average of $V_{PA}$ is above ($V_{LA}+V_{CAC}$), then an offset current of gm times [$V_{PA}$ ($V_{LA}$ $V_{CAC}$)] is input to the hysteretic comparator. If, for example, this current is 20 mA, then the new $I_{SW}/I_{OP}$ hysteretic window is +70/−30 mA, and the new LA non-zero-average $I_{LA}$ output current is approximately 20 mA, gradually charging $C_{AC}$ to increase voltage on the coupling capacitor, until the predetermined voltage $V_{CAC}$ is reached (when $V_{PA}-(V_{LA}$ $V_{CAC})$ is zero).

Figure 5A:
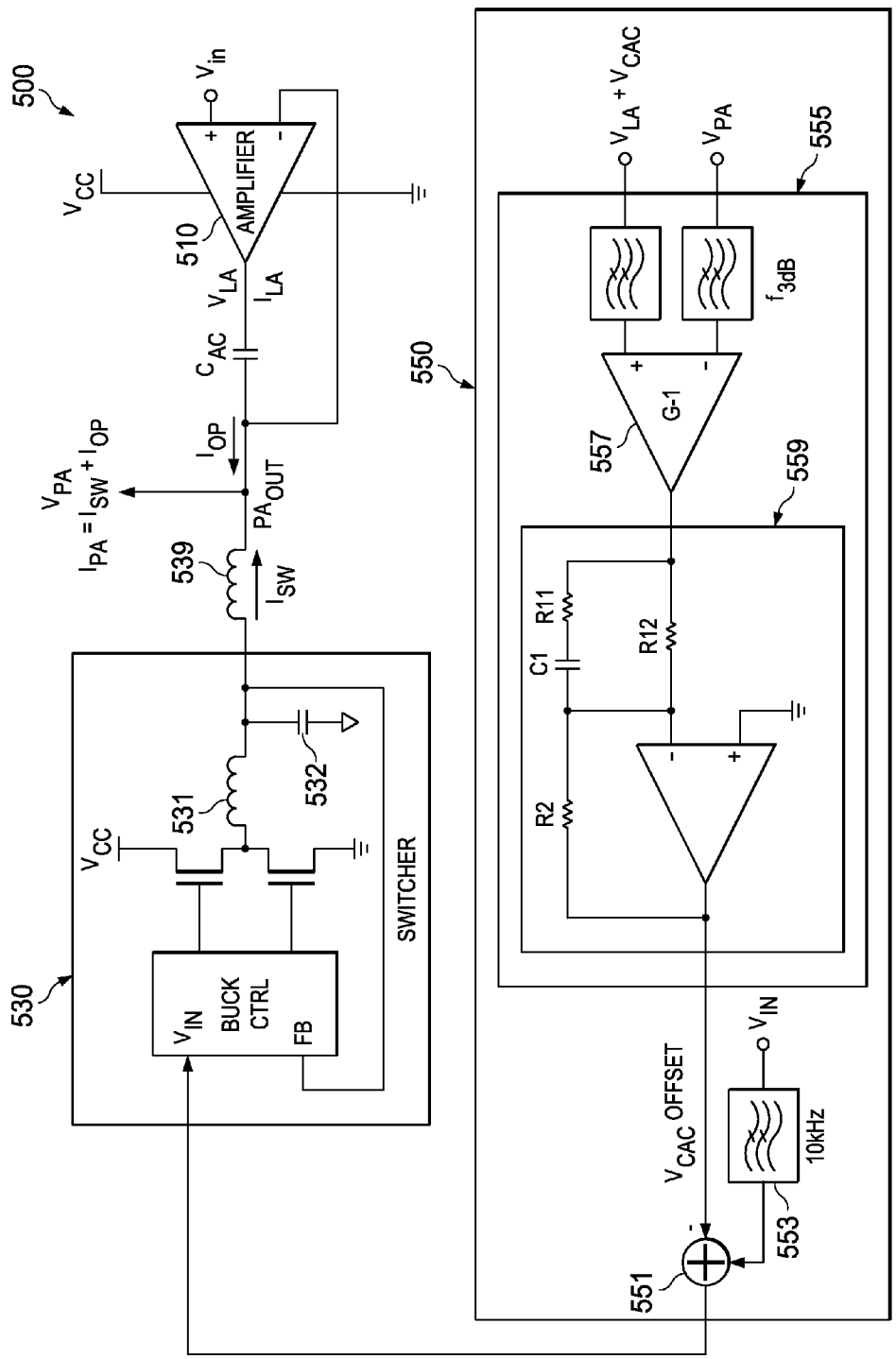
FIGS. 5A and 5B illustrate respectively an example embodiment of, and an equivalent circuit for, an alternate SMAL regulator in which the linear amplifier is AC coupled to a switched mode converter configured as a voltage supply (supplying current through an output inductor), and in which the switching (voltage) control loop is configured to effectively control the linear amplifier to provide capacitive charge control for the coupling capacitor.
Figure 5B:
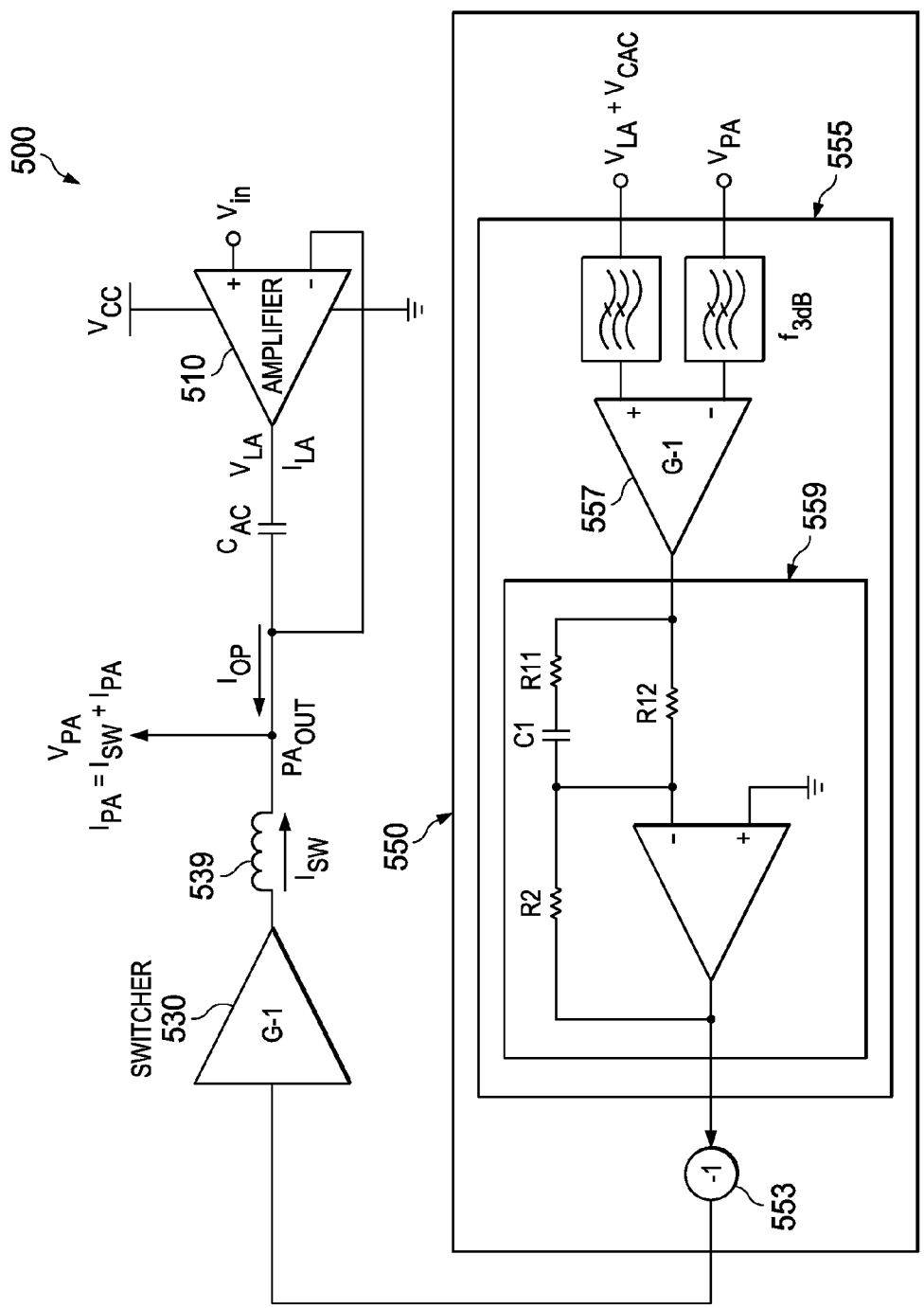
Figure 6:
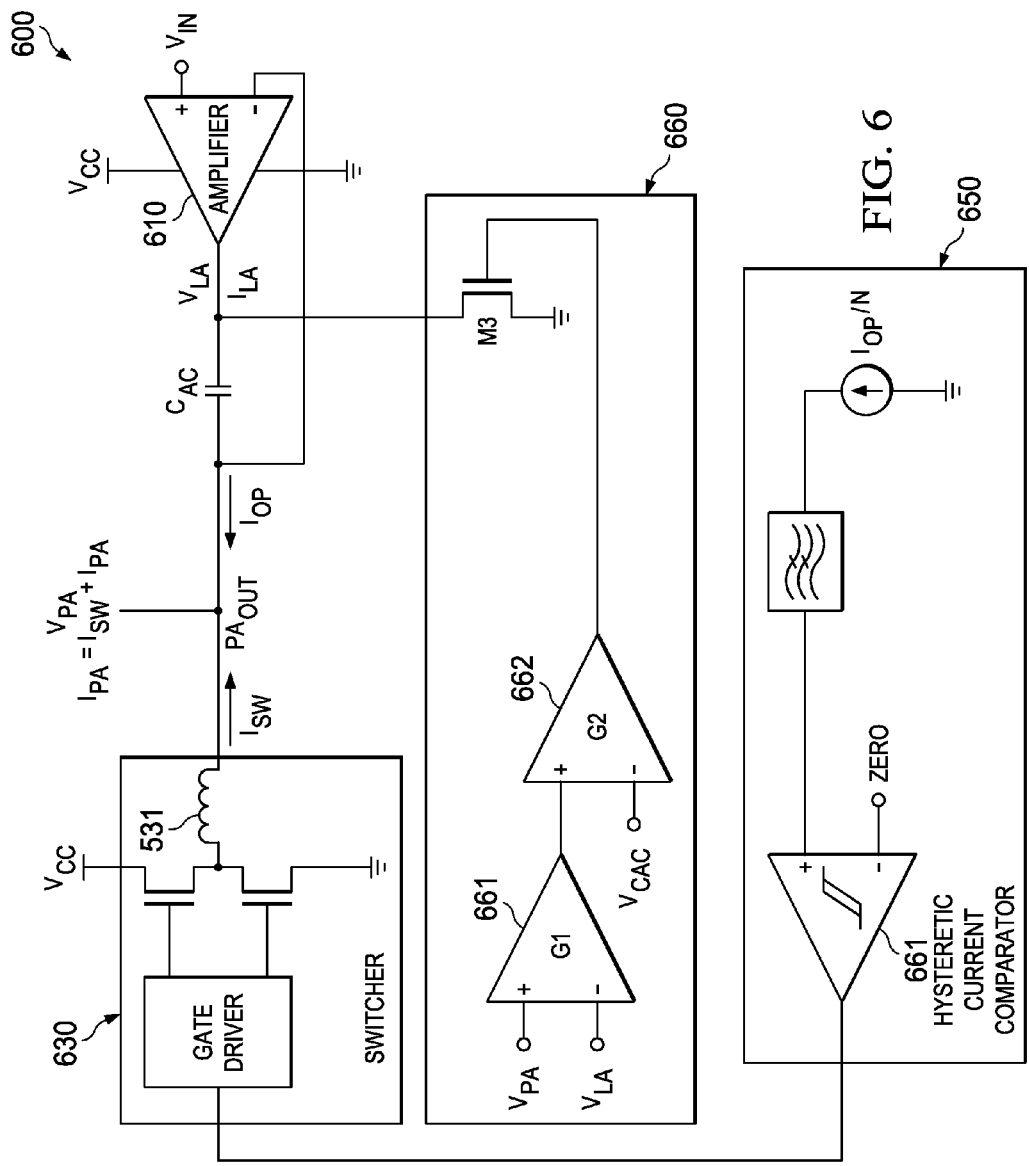
FIG. 6 illustrates an example alternate embodiment of SMAL regulator in which a linear amplifier is AC coupled to a switched mode converter, and in which capacitive charge control is implemented by a capacitive charge control loop controlling a transistor coupled to the linear amplifier side of the coupling capacitor.

FIGS. 5A and 5B illustrate respectively an example alternate embodiment of, and an equivalent circuit for, a SMAL regulator 500 with AC coupling, adapted for high frequency applications. Linear amplifier 510 is AC coupled through a coupling capacitor $C_{AC}$ to the $PA_{OUT}$ node. For this embodiment, switched mode converter 530 is implemented as a buck voltage supply, including in addition to a buck inductor 531 a buck output capacitor 532. A switching controller 550 provides voltage control to the buck converter 530, which includes a large output inductor 539 that converts the buck voltage supply to a current supply for the $I_{SW}$ load current. Switching controller 550 includes a $V_{CAC}$ control loop 455 configured to effect capacitive charge control.

Functionally, $V_{CAC}$ control loop 555 introduces a $V_{CAC}$ offset into an $I_{SW}$ control loop ($V_{IN}$) that controls the $I_{SW}$ load current supplied by switched converter 530. Responsive to the $V_{CAC}$ offset, switched converter 530 correspondingly adjusts the $I_{SW}$ load current. current such that the linear amplifier 510 adjusts its $I_{LA}$ output current to a non-zero average. As a result, the voltage on the $C_{AC}$ coupling capacitor changes based on the average current through the $C_{AC}$ coupling capacitor to the $PA_{OUT}$ node, charging/discharging the coupling capacitor $C_{AC}$ to maintain the DC-average voltage $V_{CAC}$.

Switching controller 550 includes a combiner 551 that receives two signal inputs: (a) an $I_{SW}$ control signal based on the target voltage $V_{IN}$ also input to linear amplifier 510, and (b) a $V_{CAC}$ control signal from $V_{CAC}$ control loop 555 based on the voltage across the $C_{AC}$ coupling capacitor.

For the $I_{SW}$ control signal, the target voltage $V_{IN}$ is averaged by a low pass filter 553, and provides an $I_{SW}$ control input to the switched converter 530 that corresponds to the $V_{PA}$ load voltage set by linear amplifier 510. The $I_{SW}$ control input to switched converter 530 operates to control the supply voltage on the buck output capacitor 532 such that the resulting $I_{SW}$ load current through the output inductor 539 causes the linear amplifier to output (steady-state) a zero-average $I_{LA}$ output current. The $I_{LA}$ output current is coupled through the $C_{AC}$ coupling capacitor to the $PA_{OUT}$ summing node as the $I_{OP}$ load current required to be supplied by the linear amplifier 510.

$V_{CAC}$ control loop 555 is implemented with a voltage amplifier 557 followed by a compensation network 559. The resulting $V_{CAC}$ control signal introduces a $V_{CAC}$ charge control offset signal corresponding to a predetermined coupling capacitor voltage $V_{CAC}$. The output from amplifier 557 is proportional the voltage across the $C_{AC}$ referenced to $V_{CAC}$: [$V_{PA}-(V_{LA}+V_{CAC})$]. That is, the $V_{CAC}$ offset control signal introduced by the $V_{CAC}$ control loop corresponds to the difference between (a) $V_{PA}$, the PA load voltage, and (b) ($V_{LA}+V_{CAC}$), the linear amplifier output voltage $V_{LA}$ plus the predetermined coupling capacitor voltage $V_{CAC}$. Low pass filtering these inputs reduces the requirement for high frequency common mode rejection.

When the voltage on the $C_{AC}$ coupling capacitor deviates from the predetermined $V_{CAC}$, the $V_{CAC}$ offset control signal from the $V_{CAC}$ control loop 555 [$V_{PA}-(V_{LA}+V_{CAC})$] will be non-zero. The resulting $I_{SW}$ control signal and $V_{CAC}$ offset control signal are combined by the combiner 551, driving switched converter 530 to adjust the load current $I_{SW}$, and thereby cause linear amplifier 510 to output a non-zero-average $I_{LA}$ current corresponding to [$V_{PA}-(V_{LA}+V_{CAC})$]. This non-zero-average $I_{LA}$, in addition to providing the load current $I_{OP}$, charges/discharges the $C_{AC}$ coupling capacitor to $V_{CAC}$, i.e., until [$V_{PA}-(V_{LA}+V_{CAC})$] is zeroed. At that point, the $I_{SW}$ control signal (corresponding to the low pass filtered target voltage $V_{IN}$) continues steady-state operation in driving switched converter 530 to supply load current $I_{SW}$ that minimizes the $I_{OP}$ load current from linear amplifier 510. The linear amplifier outputs a zero-average $I_{LA}$ current corresponding to the $I_{OP}$ load current, through the $C_{AC}$ coupling capacitor to the $PA_{OUT}$ summing node.

FIG. 5B illustrates an AC equivalent circuit of the embodiment of SMAL regulator 500 illustrated in FIG. 5A, approximating switched mode converter (buck) 530 as a voltage controlled voltage source. The transfer function of the control loop is given by $$H(s) = \frac{1+sCRc}{sCR_L\left(\frac{sL}{R_L}+1\right)} \times \frac{1}{1+s/(2\pi f 3d5)} \times \frac{R_2}{R_{12}} \frac{1+sC_1(R_{12}+R_{11})}{1+sC_1R_{11}}$$

All quantities are shown in FIG. 5B except $R_C$ which is the ESR of the coupling capacitor CAC (designated C in the transfer function) and $R_L$ which is the ESL of L. Poles and zeros are: P1=0; P2=−RL/L; P3=−2πf3 dB, P4=−1/C1R11; Z1=−1CRC; Z2=−1/(C1(R12+R11)). For example: (P2) assuming ESR of 100 mOhm and L of 100 uH, this pole can be located at 160 Hz; (P3) this pole can provide additional freedom to filter out any high frequency noise across the capacitor C, caused by the linear amplifier current; (P4) this pole can provide additional freedom to filter out any high frequency noise across the capacitor C, caused by the linear amplifier current; (Z1) assuming ESR of 20 m Ohm and C of 50 uF, this zero can be located at 166 kHz (very high frequency pole); (Z2) this zero can be set to stabilize the loop and increase phase margin.

FIG. 6 illustrates an example embodiment of an alternate SMAL regulator architecture 600 with AC coupling, in which capacitive charge control is implemented in the linear amplifier stage. Specifically, linear amplifier stage 610 includes a $V_{CAC}$ (charge) control transistor M3 and associated $V_{CAC}$ control circuit 660. For the example embodiment, $V_{CAC}$ control transistor M3 is an operating mode transistor operated in the linear region to provide capacitive charge control—in another operating mode not the subject of this Patent Disclosure, is used to ground the coupling capacitor (with the linear amplifier is disabled).

SMAL regulator 600 includes a switched converter 630 implemented as a buck current supply. The buck switched converter 630 is coupled through a buck inductor 631 to the $PA_{OUT}$ node.

A switching controller 650 is configured to control switched converter 630 to supply $I_{SW}$ load current that minimizes the $I_{OP}$ load current required to be supplied by linear amplifier 610. Switching controller 650 includes a hysteretic current comparator 651 that defines an $I_{SW}/I_{OP}$ hysteretic window. The hysteretic current comparator 651 receives an $I_{OP}/N$ input derived from an $I_{SW}$ control loop based on a current $I_{OP}/N$ corresponding to the $I_{OP}$ load current supplied by linear amplifier 610. This $I_{OP}/N$ input is compared to a zero reference corresponding to the DC average of the $I_{OP}$ load current (for AC coupled implementations, zero). The $I_{SW}$ control loop operates to drive switched converter 630 to supply $I_{SW}$ load current to minimize the $I_{OP}$ load current from the linear amplifier by maintaining $I_{OP}/N$ (low pass filtered) within the $I_{SW}/I_{OP}$ hysteretic window. As a result, linear amplifier 610 outputs (steady-state) a zero-average output current $I_{LA}$, coupled through the $C_{AC}$ coupling capacitor to the $PA_{OUT}$ summing node as the $I_{OP}$ load current supplied by the linear amplifier 610.

$V_{CAC}$ control loop 660 includes cascade differential amplifiers 661 and 662, configured to implement $V_{CAC}$ control based on the voltage across the $C_{AC}$ coupling capacitor. The output of amplifier 662 provides a $V_{CAC}$ control signal to the M5 control gate.

$V_{CAC}$ control loop 660 can be represented as $[V_{PA}-(V_{LA}+V_{CAC})]$, or for the configuration of FIG. 6, $[(V_{PA}-V_{LA})-V_{CAC}]$. That is, the amplifiers 661/662 generate the $V_{CAC}$ control signal which corresponds to the voltage across the coupling capacitor $(V_{PA}-V_{LA})$ relative to the predetermined DC-average voltage $V_{CAC}$. In particular, feedback ensures that $V_{CAC}$ applied to the negative input of amplifier 662 will appear across the $C_{AC}$ coupling capacitor, which allows precise control of the $V_{CAC}$ coupling capacitor voltage.

When the voltage on the $C_{AC}$ coupling capacitor deviates from the predetermined $V_{CAC}$ (non-zero $[(V_{PA}-V_{LA})-V_{CAC}]$) the $V_{CAC}$ control signal from $V_{CAC}$ control loop 660 (amplifier 662) controls M3 to effect charging/discharging the coupling capacitor $C_{AC}$, until $[(V_{PA}-V_{LA})-V_{CAC}]$ is zeroed. The separate $I_{SW}$ control loop 650 continues steady-state operation, driving switched converter 630 to supply $I_{SW}$ load current that minimizes the $I_{OP}$ load current required to be supplied by the linear amplifier 610. In this steady-state case (with $V_{CAC}$ on the $C_{AC}$ coupling capacitor), linear amplifier 610 outputs a zero-average $I_{LA}$ current through $C_{AC}$ to the $PA_{OUT}$ summing node as the $I_{OP}$ load current.

Decoupling Output Impedance and Signal Path Bandwidth.

Figure 7A:
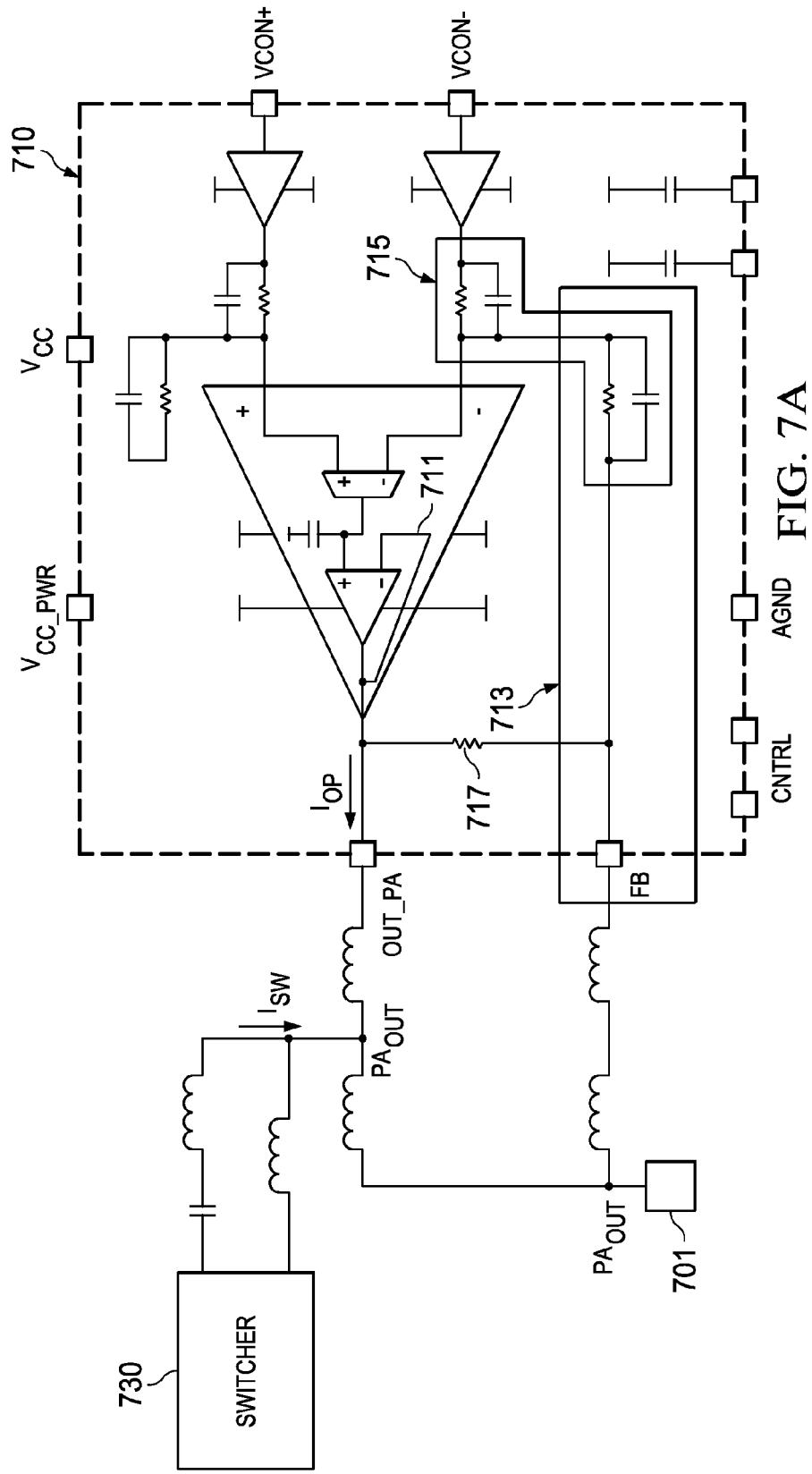
FIG. 7A illustrates an example embodiment of a SMAL regulator including a linear amplifier design with decoupled output impedance and signal path bandwidth, including a local/internal (higher speed) feedback loop configured for increased output impedance bandwidth, and an external feedback network configurable to establish signal path bandwidth independent of output impedance bandwidth.
Figure 7B:
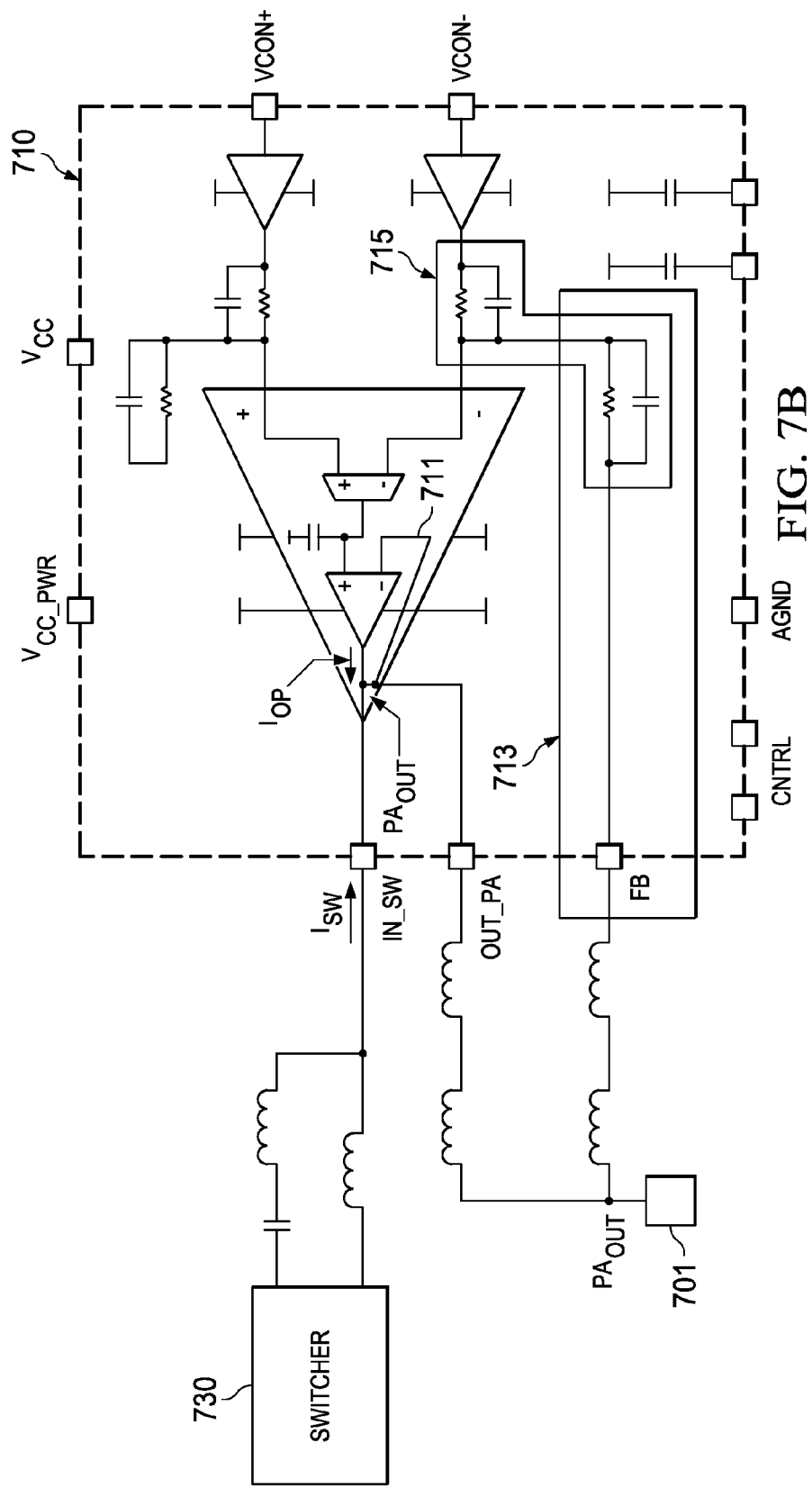
FIG. 7B illustrates an example alternate embodiment of the SMAL regulator of FIG. 7A, in which the switched mode converter is coupled directly to the local/internal feedback loop of the linear amplifier, reducing parasitic trace inductance (coupled, for an example IC implementation, to a dedicated IN_SW pin).

FIGS. 7A and 7B illustrate example embodiments of SMAL regulator 700 in a system configuration with a power amplifier 701 (such as for use in the RF transmitter system illustrated in FIG. 1A/B). SMAL regulator 700 includes linear amplifier 710 and a switched mode converter 730, parallel coupled at an output node $PA_{OUT}$ to PA 701. Control for the switched mode converter is integrated with the switched mode converter and not separately illustrated (compare, for example, controller 250 in FIG. 2).

As illustrated, the example embodiments of SMAL regulator 700 are configured with DC coupling (such as also illustrated in FIG. 2), with appropriate modification, the Description related to these embodiments would also apply to AC coupled embodiments/implementations.

As illustrated, linear amplifier 710 and switched converter 730 are implemented as separate integrated circuits (ICs)—a SMAL regulator according to this Disclosure can be adapted to a single-IC implementation. System interconnect will necessarily include trace inductance that can impact operation at higher frequencies (discussed in connection with the embodiment in FIG. 7B).

SMAL regulator 700 supplies to the PA ($PA_{OUT}$) regulated voltage $V_{PA}$ and current $I_{PA}$. In accordance with this Disclosure, (a) PA load voltage $V_{PA}$ is dynamically set by the linear amplifier 710, and (b) PA load current $I_{PA}$ is supplied by linear amplifier 710 with primary current assist supplied by switched converter 730. Switched converter 730 is configured to supply lower frequency $I_{SW}$ load current, and the linear amplifier 710 is configured to supply $I_{OP}$ load current not supplied by the switched converter (i.e., sourcing/sinking PA load current $I_{PA}$ not supplied by the switched converter). $I_{SW}$ and $I_{OP}$ summed at the $PA_{OUT}$ supply node.

Linear amplifier 710 outputs voltage $V_{LA}$ and current $I_{LA}$. For the example DC coupled implementations, output voltage $V_{LA}$ corresponds to the regulated load voltage $V_{PA}$ supplied to PA 701, and output current $I_{LA}$ corresponds to the load current $I_{OP}$ supplied by the linear amplifier. For the example IC implementations, $V_{LA}$ and $I_{LA}$ are available at an output pin OUT_PA.

The linear amplifier design 710 can be configured for decoupling output impedance and signal path bandwidth, enabling signal path bandwidth to be established relatively independent of output impedance bandwidth. The linear amplifier includes a local/internal (higher speed) feedback loop configured for controlling output impedance bandwidth, and a global/external feedback network configurable to independently establish signal path bandwidth. As used in this Disclosure, output Impedance bandwidth refers to the bandwidth over which the output impedance of a SMAL regulator remains low relative to the frequencies of interest and the load.

Figure 8:
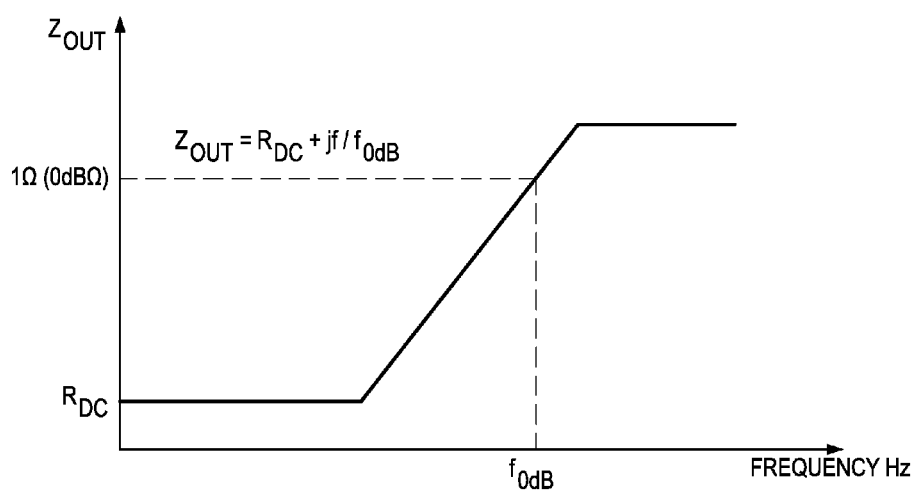
FIG. 8 illustrates the relationship between closed-loop output impedance ($Z_{OUT}$) and frequency.

FIG. 8 illustrates the relationship between closed-loop output impedance (Zout) and frequency—this description will be in the context of a negative feedback operational amplifier which corresponds in relevant respects to a linear amplifier such as used in a SMAL regulator according to this Disclosure. The closed-loop output impedance Zout is characterized by a low resistance $R_{DC}$ at lower frequencies where the amplifier has significant loop gain. At higher frequencies, the amplifier loop gain drops and output impedance Zout increases. A design parameter is the zero dB crossing frequency f0dB (ZCF), defined as the frequency at which system output impedance rises to zero dB-ohms (1 ohm in non-dB units).

In the context of the example RF application, the higher the ZCF for the output impedance of the linear amplifier, the higher the output impedance bandwidth, and the lower the RX band noise at a power amplifier. That is, a linear amplifier with a high ZCF relative to the RF frequencies of interest is advantageous in actively rejecting high-frequency voltage disturbances introduced internal to a SMAL regulator by the switched mode converter, or externally from the dynamic PA load (noise output from the PA supply pin). Thus, it can be advantageous to increase output impedance bandwidth (increase ZCF) to reduce RX band noise. However, a design trade-off can be to reduce signal path bandwidth to increase efficiency (that is, limiting signal path bandwidth to the bandwidth requirement for envelope tracking) and/or increase design flexibility (such as by reducing design complexity).

FIGS. 7A/7B include a high level functional illustration of a linear amplifier design 710, including decoupling output impedance bandwidth from signal path bandwidth. Specific implementations of a linear amplifier for use in a SMAL regulator according to this Disclosure represent a design choice, and other amplifier architectures are adaptable as a linear amplifier according to this Disclosure, including implementing design alternatives and/or trade-offs to improve efficiency under different operating conditions and for different applications.

Referring to FIG. 7A, linear amplifier 710 receives a differential envelope tracking signal (VCON+/−), such as from an RFIC (this differential signal corresponds to $V_{IN}$ in FIGS. 2, 4, 5A/5B and 6). In response, linear amplifier 710 supplies a regulated, single-ended load voltage $V_{PA}$ ($V_{LA}$) to the PA 701.

Linear amplifier 710 includes both an internal (higher speed) feedback loop 711 configured for reducing output impedance at the frequencies of interest, and an external (lower speed) feedback network 713 configured to establish signal path bandwidth. For the illustrated IC implementation, the external feedback network 713 is connected to $PA_{OUT}$, between the FB and OUT_PA pins.

The local/internal (higher speed) feedback loop 711 enables increased output impedance bandwidth. The internal feedback loop 711 reduces output impedance at higher frequencies, increasing zero crossing frequency (ZCF in FIG. 8), and thereby increasing output impedance bandwidth. A capacitive divider network 715 at the inverting VCON− input to linear amplifier 710 can be used to provide further control at higher frequencies.

The global/external feedback network 713 can be configured to establish signal path bandwidth, including optimizing SMAL regulator 700 for reduced signal path bandwidth leading to increased efficiency. For example, using relatively large resistive values in the external feedback loop 713 will slow the feedback loop, and reduce signal path bandwidth, without appreciably affecting output impedance bandwidth for the frequencies of interest. In addition, a parallel resistance 717 can be used to stabilize the external feedback loop 713 at high frequencies by shorting the (trace) inductance in the feedback loop between the OUT_PA and FB pins, thereby improving phase margin.

FIG. 7B illustrates an example alternate embodiment of the SMAL regulator 700 of FIG. 7A, in which switched converter 730 is connected at the output of the linear amplifier 710, effectively at the local/internal feedback loop 711, reducing parasitic trace inductance between switched converter 730 and linear amplifier 710. For the example IC implementation, switched converter 730 connects to a separate IN_SW pin of linear amplifier 710. With this system interconnect configuration, the $PA_{OUT}$ node is effectively at the linear amplifier, reducing the affects of trace inductance (distortion caused by switching and ripple noise).

Example embodiments of the switched mode assisted linear amplifier/regulator architecture have been described in the context of an example application as an envelope modulated (or tracking) power supply for an RF power amplifier. Other applications for a SMAL amplifier/regulator architecture according to this Disclosure include audio power supplies, audio amplifiers (with integrated power) and power line communications.

The Disclosure provided by this Description and the Figures sets forth example embodiments and applications, including associated operations and methods, that illustrate various aspects and features of the invention. These example embodiments and applications may be used by those skilled in the art as a basis for design modifications, substitutions and alternatives to construct other embodiments, including adaptations for other applications, Accordingly, this Description does not limit the scope of the invention, which is defined by the Claims.

The invention claimed is:

1. A switch modes assisted (SMAL) regulator for supplying a regulated load voltage and associated load current to a dynamic load characterized by a signal bandwidth, comprising:
   an amplifier circuit; and
   a switched mode converter (switcher) circuit coupled in parallel at a supply node coupled to the dynamic load;
   the SMAL regulator is configured to supply the regulated load voltage and the associated load current based on a signal path bandwidth, wherein:
      the amplifier circuit, in response to a dynamic input signal, supplies the regulated load voltage;
      the switcher circuit, in response to a switching control signal with a switcher bandwidth that is less than the signal path bandwidth, supplies a switcher load current based on the switcher bandwidth; and
      the amplifier circuit supplies an amplifier load current corresponding to the associated load current not supplied by the switcher load current; and
   the amplifier circuit is configured with first and second negative feedback loops such that the first feedback loop is a higher speed than the second negative feedback loop, and wherein:
      the first negative feedback loop is configured to control an output impedance bandwidth of the amplifier circuit; and
      the second negative feedback loop is configured to control the signal path bandwidth substantially independently of the output impedance bandwidth;
      thereby decoupling the configuration of the output impedance bandwidth from the signal path bandwidth.

2. The SMAL regulator of claim 1, wherein a current control loop is configured to maximize the switcher load current, such that the amplifier load current is minimized.

3. The SMAL regulator of claim 1, wherein the signal path bandwidth is less than the signal bandwidth.

4. The SMAL regulator of claim 1, wherein the output impedance bandwidth is maximized independent of configuring signal path bandwidth.

5. The SMAL regulator of claim 1, wherein the switcher circuit is connected at an output of the amplifier circuit, such that the supply node is at the output of the amplifier circuit, thereby minimizing trace inductance between the switcher circuit and the amplifier circuit.

6. The SMAL regulator of claim 1, wherein the switcher circuit is configured as a voltage supply, including:
   an output capacitor storing a controlled voltage; and
   an output inductor coupled between the output capacitor and the supply node, such that the controlled voltage on the output capacitor is converted into the switcher load current supplied by the switcher circuit to the supply node.

7. A system, comprising:
   a power amplifier (PA) coupled to receive a dynamic input signal with a signal bandwidth, and configured to output an amplified signal corresponding to the dynamic input signal, the power amplifier including a supply input;
   a switched mode assisted linear (SMAL) regulator including an amplifier circuit and a switched mode converter (switcher) coupled in parallel at a supply node coupled to the supply input of the power amplifier;
   the SMAL regulator is configured to supply a regulated load voltage and a PA load current based on a signal path bandwidth, wherein:
      the amplifier circuit, in response to a dynamic input signal, supplies the regulated load voltage;
      the switcher, in response to a switching control signal with a switcher bandwidth that is less than the signal path bandwidth, supplies a switcher load current based on the switcher bandwidth; and
      the amplifier circuit supplies an amplifier load current corresponding to the PA load current not supplied by the switcher load current; and
   the amplifier is configured with first and second negative feedback loops such that the first negative feedback loop is higher speed than the second negative feedback loop, and wherein:
      the first negative feedback loop is configured to control an output impedance bandwidth of the amplifier circuit; and
      the second negative feedback loop is configured to control the signal path bandwidth substantially independently of the output impedance bandwidth;
      thereby decoupling the configuration of the output impedance bandwidth from the signal path bandwidth.

8. The system of claim 7, wherein a current control loop is configured to maximize the switcher load current, such that the amplifier load current is minimized.

9. The system of claim 7, wherein the signal path bandwidth is less than the signal bandwidth.

10. The system of claim 7, wherein the output impedance bandwidth is maximized independent of configuring the signal path bandwidth.

11. The system of claim 7, wherein the switcher is connected at an output of the amplifier circuit, such that the supply node is at the output of the amplifier, thereby minimizing trace inductance between the switcher circuit and the amplifier.

12. The system of claim 7, wherein the switcher is configured as a voltage supply, including:
   an output capacitor storing a controlled voltage; and
   an output inductor coupled between the output capacitor and the supply node, such that the controlled voltage on the output capacitor is converted into the switcher load current supplied by the switcher to the supply node.

13. A method for supplying a regulated load voltage and associated load current to a dynamic load characterized by a signal bandwidth, the method operable with a switched mode assisted linear (SMAL) regulator, including an amplifier and a switched mode converter (switcher) coupled in parallel at a supply node coupled to the dynamic load, the SMAL regulator characterized by a signal path bandwidth, the method comprising:
   configuring the amplifier to independently control the signal path bandwidth of the SMAL regulator and an output impedance bandwidth of the amplifier, thereby decoupling a configuration of the output impedance bandwidth from the signal path bandwidth, by
   establishing first and second negative feedback loops such that the first negative feedback loop is higher speed than the second negative feedback loop, and wherein:
      the first negative feedback loop is configured to control the output impedance bandwidth of the amplifier; and
      the second negative feedback loop is configured to control the signal path bandwidth of the SMAL regulator;
   in response to an input signal with the signal bandwidth, supplying from the amplifier, the regulated voltage with the signal path bandwidth;
   in response to a switching control signal with a switcher bandwidth that is less than the signal path bandwidth, supplying from the switcher, a switcher load current corresponding to the associated load current and the switcher bandwidth; and
   supplying, from the amplifier, an amplifier load current corresponding to the signal path bandwidth and the associated load current not supplied by the switcher load current.

14. The method of claim 13, wherein the switcher is controlled to maximize the switcher load current, such that the amplifier load current is minimized.

15. The method of claim 13, wherein the signal path bandwidth is less than the signal bandwidth.

16. The method of claim 13, wherein the output impedance bandwidth is maximized independent of the configuring signal path bandwidth.

17. The method of claim 13, wherein the switcher is connected at an output of the amplifier, such that the supply node is at the output of the amplifier, thereby minimizing trace inductance between the switcher circuit and the amplifier.

18. The method of claim 13, wherein the switcher is configured as a voltage supply, including:
   an output capacitor storing a controlled voltage; and
   an output inductor coupled between the output capacitor and the supply node, such that the controlled voltage on the output capacitor is converted into the switcher load current supplied by the switcher to the supply node.

* * * * *